(12) United States Patent
Hatakeyama et al.

(10) Patent No.: US 8,749,114 B2
(45) Date of Patent: Jun. 10, 2014

(54) ACOUSTIC WAVE DEVICE

(75) Inventors: Kazushige Hatakeyama, Kanagawa (JP); Takashi Miyagawa, Kanagawa (JP)

(73) Assignee: Taiyo Yuden Co., Ltd., Tokyo (JP)

(*) Notice: Subject to any disclaimer, the term of this patent is extended or adjusted under 35 U.S.C. 154(b) by 379 days.

(21) Appl. No.: 13/352,500

(22) Filed: Jan. 18, 2012

(65) Prior Publication Data
US 2012/0181898 A1 Jul. 19, 2012

(30) Foreign Application Priority Data
Jan. 19, 2011 (JP) ................. 2011-009302

(51) Int. Cl.
*H01L 41/053* (2006.01)
*H03H 9/05* (2006.01)

(52) U.S. Cl.
CPC .................... *H03H 9/058* (2013.01)
USPC ..................... 310/313 R; 310/344

(58) Field of Classification Search
CPC ....... H03H 9/058; H03H 9/059; H03H 9/064; H03H 9/1078; H03H 9/1092
USPC ................................. 310/313, 344
See application file for complete search history.

(56) References Cited

U.S. PATENT DOCUMENTS

| 6,078,229 A * | 6/2000 | Funada et al. ............. 310/313 R |
| 6,369,490 B1 * | 4/2002 | Taga ......................... 310/313 R |
| 6,731,046 B2 * | 5/2004 | Watanabe et al. ......... 310/313 R |
| 7,002,282 B2 * | 2/2006 | Mishima ................... 310/313 R |
| 7,034,434 B2 * | 4/2006 | Yamamoto et al. ....... 310/313 R |
| 7,513,022 B2 * | 4/2009 | Shimada et al. .......... 310/313 R |
| 8,076,827 B2 * | 12/2011 | Saitou et al. .................. 310/344 |
| 8,471,441 B2 * | 6/2013 | Tsuda ....................... 310/313 R |
| 2013/0057361 A1 * | 3/2013 | Sakano et al. ................ 333/193 |

FOREIGN PATENT DOCUMENTS

JP 2004-064599 A 2/2004
WO WO2013129175 A1 * 9/2013

* cited by examiner

*Primary Examiner* — J. San Martin
(74) *Attorney, Agent, or Firm* — Chen Yoshimura LLP

(57) ABSTRACT

An acoustic wave device includes, a substrate, an acoustic wave device chip that has a vibration part exciting an acoustic wave and is mounted on a surface of the substrate so that the vibration part is exposed to a space formed between the substrate and the acoustic wave device chip, and a joining part that is provided so as to surround the vibration part and joins the substrate and the acoustic wave device chip together. The joining part includes a first member made of solder, and a second member that is stacked on the first member and is made of a substance having a melting point higher than the solder. The second member has a thickness larger than a coplanarity of the surface of the substrate.

5 Claims, 9 Drawing Sheets

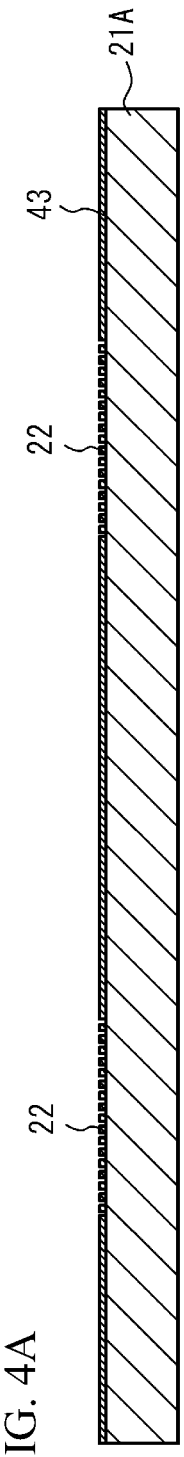
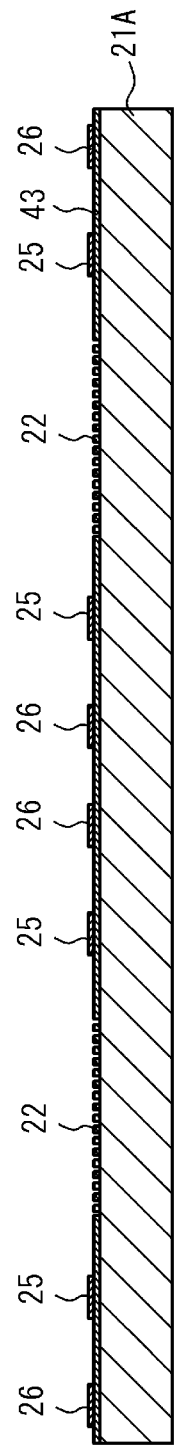
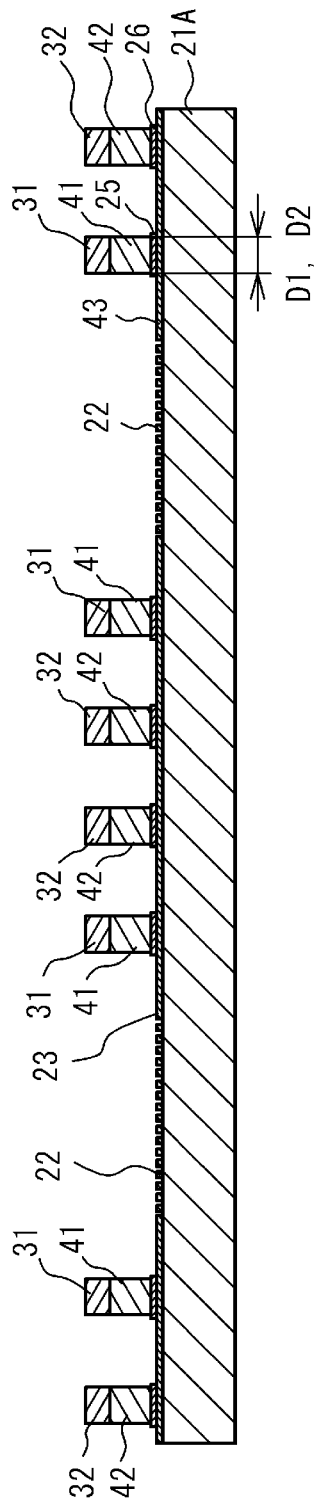
FIG. 4A
FIG. 4B
FIG. 4C

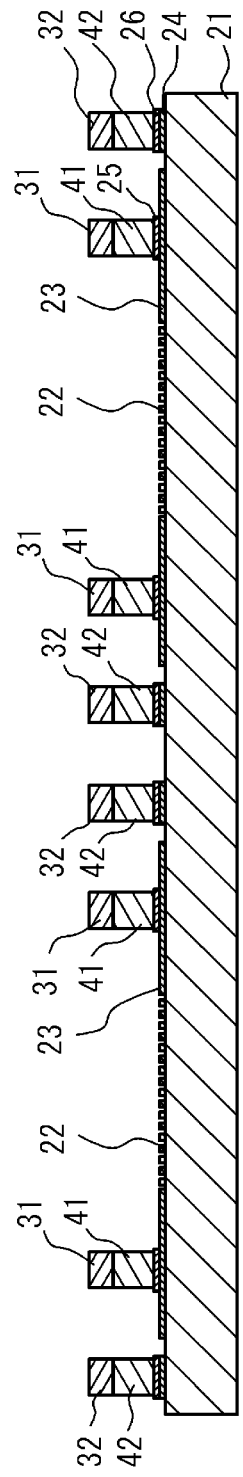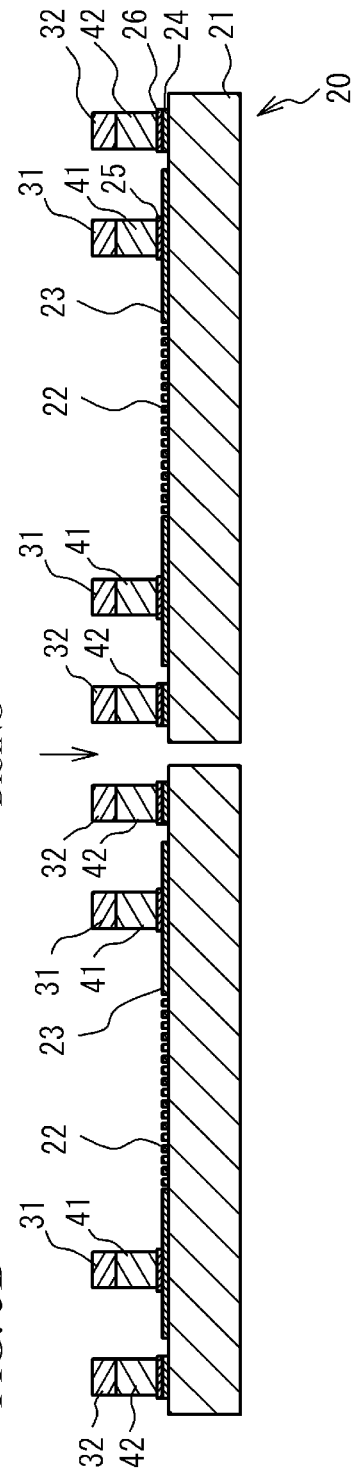

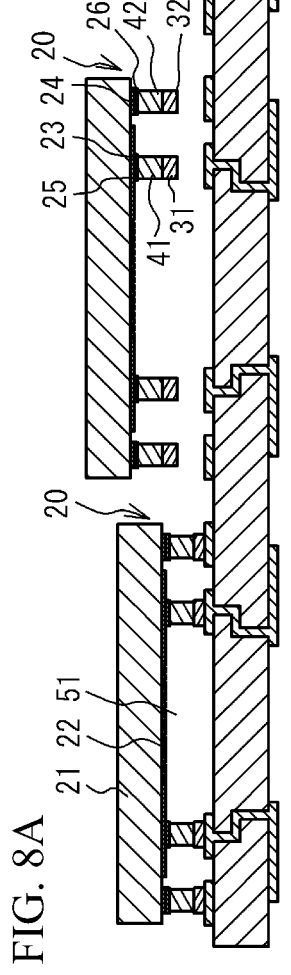
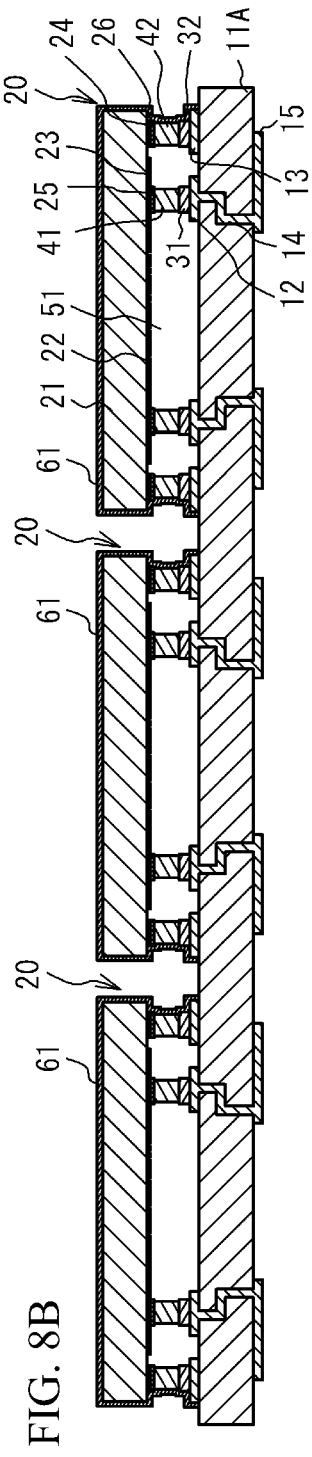
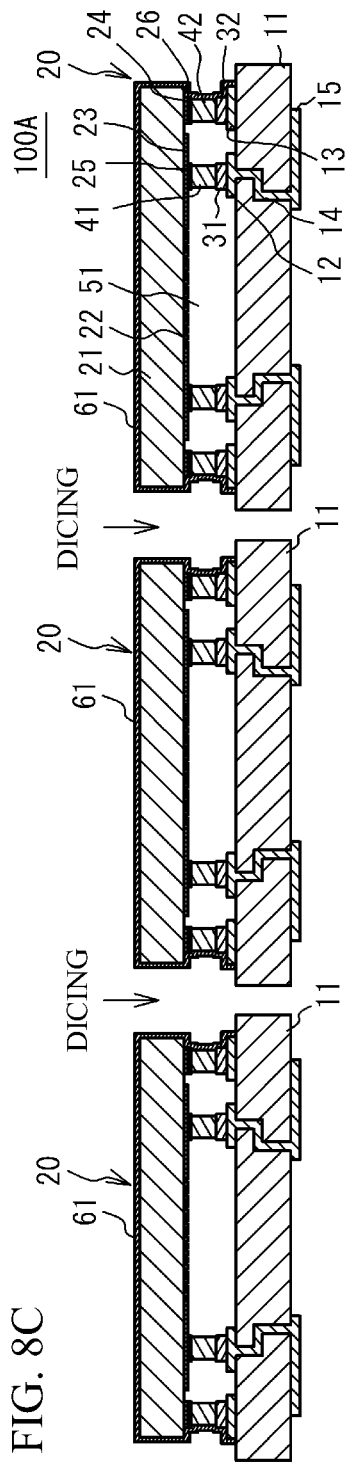
FIG. 8A
FIG. 8B
FIG. 8C

ACOUSTIC WAVE DEVICE

CROSS-REFERENCE TO RELATED APPLICATION

This application is based upon and claims the benefit of priority of the prior Japanese Patent Application No. 2011-009302, filed on Jan. 19, 2011, the entire contents of which are incorporated herein by reference.

FIELD

A certain aspect of the present invention relates to acoustic wave devices.

BACKGROUND

It is required to downsize an acoustic wave device used as a filter, a duplexer or the like in mobile communication equipment. An acoustic wave element for the acoustic wave device may be a surface acoustic wave (SAW) device or a piezoelectric thin-film resonator. The SAW device has a piezoelectric substrate on which an interdigital transducer (IDT) is formed. The piezoelectric thin-film resonator, which is frequently called film bulk acoustic resonator (FBAR), has a piezoelectric thin film sandwiched between electrodes. For example, Japanese Patent Application Publication No. 2004-64599 discloses an arrangement in which a SAW device is face-down mounted on a base substrate, and an IDT formed on a piezoelectric substrate is hermetically sealed with a bonding member such as solder provided on a peripheral portion of the piezoelectric substrate.

A conventional acoustic wave device has a possibility that solder for sealing and/or solder bump electrodes used along with solder for sealing may cause a short-circuit between IDT electrode fingers and/or a deterioration of the characteristics.

SUMMARY OF THE INVENTION

According to an aspect of the present invention, there is provided an acoustic wave device including: a substrate; an acoustic wave device chip that has a vibration part exciting an acoustic wave and is mounted on a surface of the substrate so that the vibration part is exposed to a space formed between the substrate and the acoustic wave device chip; and a joining part that is provided so as to surround the vibration part and joins the substrate and the acoustic wave device chip together, the joining part including a first member made of solder, and a second member that is stacked on the first member and is made of a substance having a melting point higher than the solder, the second member having a thickness larger than a coplanarity of the surface of the substrate.

BRIEF DESCRIPTION OF THE DRAWINGS

FIGS. 4A through 4C are cross-sectional views that illustrate a method for fabricating the acoustic wave device of the first embodiment;

FIGS. 5A and 5B are cross-sectional views that illustrate the method for fabricating the acoustic wave device of the first embodiment and follows the step of FIG. 4C;

FIGS. 8A through 8C are cross-sectional views that illustrate a method for fabricating an acoustic wave device in accordance with a variation of the first embodiment.

DETAILED DESCRIPTION

First, a comparative example is described in order to point out a problem of acoustic wave devices.

Figure 1A:
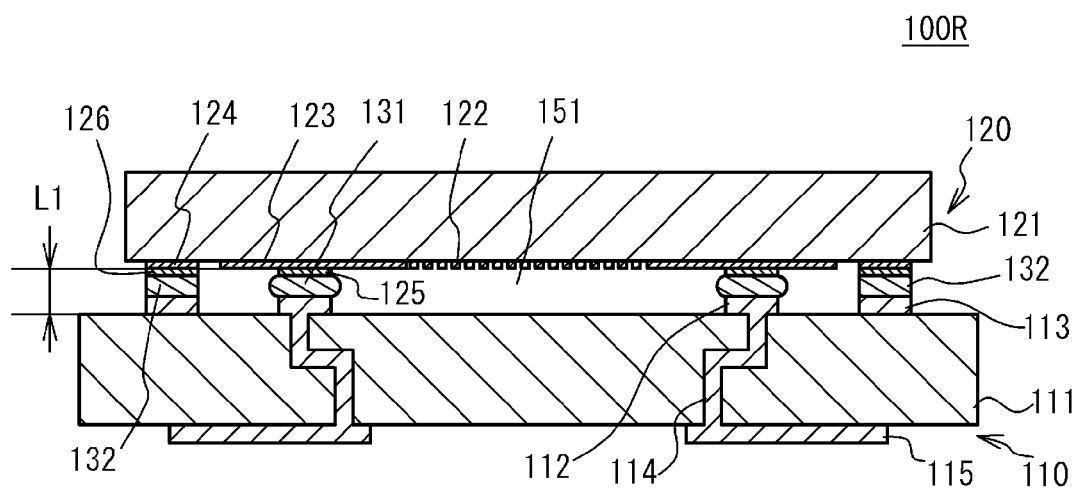
FIGS. 1A and 1B are cross-sectional views of an acoustic wave device in accordance with a comparative example.

Referring to FIG. 1A, an acoustic wave device 100R of a comparative example has an insulative substrate 111, which is a chip support substrate 110, electrodes 112, a seal metal layer 113, via interconnections 114 and external connection terminals 115. The insulative substrate 111 may be made of resin such as epoxy resin or an insulative member such as ceramic. The insulative substrate 111 may have a single-layer substrate or a multilayer substrate. The electrodes 112, the sealing metal layer 113, the via interconnections 114 and the external connection terminals 115 may be made of a metal, which is, for example, a sintered compact of tungsten paste. Further, the electrodes 112 and the seal metal layer 113 have a nickel layer and a gold layer formed on the nickel layer. The nickel layer is provided on the underlying film on the upper surface of the insulative substrate 111 on which an acoustic wave device chip 120 is mounted. The external connection terminals 115 are provided on the lower surface of the insulative substrate 111. The via interconnections 114 pass through the insulative substrate 111, and electrically interconnect the electrodes 112 and the external connection terminals 115. The seal metal layer 113 is formed into a loop shape so as to correspond to a seal metal layer 124 of the acoustic wave device chip 120.

The acoustic wave device chip 120 has a piezoelectric substrate 121 having a surface on which a vibration part 122, interconnections 123 and the seal metal layer 124 are provided. The piezoelectric substrate 121 is made of a piezoelectric substance such as lithium tantalate ($LiTaO_3$) or lithium niobate ($LiNbO_3$). As will be described later, the vibration part 122 includes an IDT and reflectors, and excites an acoustic wave. In a case where the acoustic wave device chip 120 is a SAW device chip, the acoustic wave device chip 120 is flip-chip (face down) mounted on the upper surface of the insulative substrate 111, whereby the vibration part 122 faces the insulative substrate 111, and is exposed to a space 151. A distance L1 between the vibration part 122 and the insulative substrate 111 is tens of μm, for example. Due to the presence of the space 151, the vibration of the vibration part 122 is not disturbed. In order to secure good vibration of the vibration part 122, the distance L1 is not less than 1 μm.

The vibration part 122, the interconnections 123 and the seal metal layer 124 may be formed by an identical metal layer, which is, for example, an alloy of aluminum and copper and is 200 nm thick. The interconnections 123 extend from the vibration part 122 and include terminal portions for making external connections. The seal metal layer 124 is formed into a loop shape on the mount surface of the piezoelectric substrate 121 on which the acoustic wave device chip 120 is mounted. The seal metal layer 124 extends along the peripheries of the mount surface of the piezoelectric substrate 121 so as to surround the vibration part 122 and the interconnections 123, and is spaced apart therefrom (electrically isolated therefrom). An underlying film 125 is provided on the surface of the terminal portions of the interconnections 123, and an underlying film 126 is provided on the surface of the seal metal layer 124. The underlying films 125 and 126 may have a gold/titanium multilayer structure, for example.

Solder members 132 are provided between the underlying film 125 and the electrodes 112, and a solder member 132 is provided between the underlying film 126 and the seal metal layer 124. The seal metal layer 124 of the acoustic wave device chip 120 and the seal metal layer 113 of the chip support substrate 110 are connected together by the solder member 132 to form a seal ring, which hermetically seals the vibration part 122 and the interconnections 123 of the acoustic wave device chip 120.

Figure 1B:
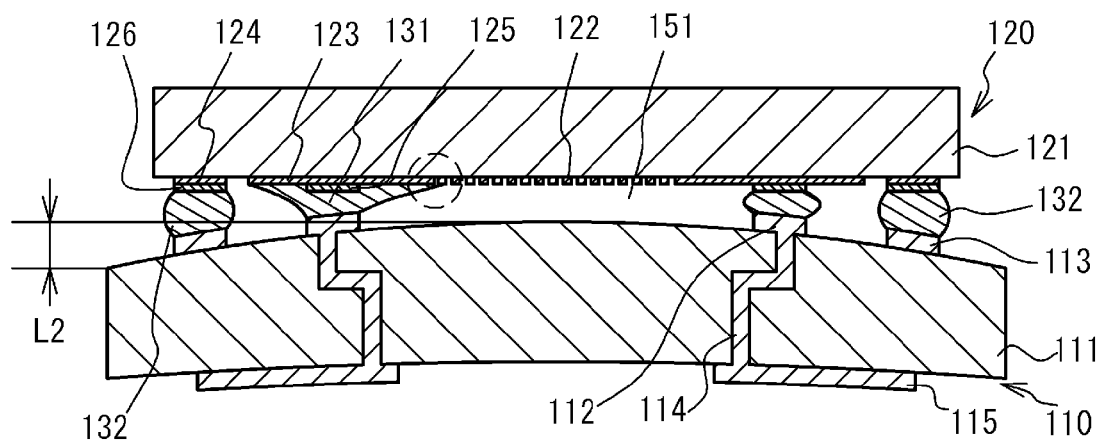

In the flip-chip bonding, as illustrated in FIG. 1B, the insulative substrate 111 may be deformed. The interconnection pattern made of a conductive material is formed on the insulative substrate 111. Heat is applied to the insulative substrate 111 by a thermal history such as a solder reflow process. The difference in thermal contraction between the different materials may deform the insulative substrate 111 considerably.

FIG. 1B illustrates a case where the insulative substrate 111 is curved. A coplanarity L2 of the upper surface of the insulative substrate 111 may be a few μm to 20 μm. The coplanarity is the difference in height between the highest point and the lowest point on the same plane. When the coplanarity deteriorates or increases, the distance L1 between the insulative substrate 111 and the acoustic wave device chip 120 decreases, and it may become difficult to secure the space 151. In this case, the vibration part 122 may contact the insulative substrate 111. In a case where the space 151 is not secured, the vibration of the vibration part 122 is disturbed and the characteristics of the acoustic wave device chip 120 may deteriorate. In order to secure the space 151 and set the distance L1 equal to or larger than a predetermined value, an increased amount of solder for the solder members 131 and 132 is used to realize a larger thickness. It is to be noted that the thickness is measured vertically in FIG. 1B.

However, in the flip-chip bonding, the acoustic wave device chip 120 and the chip support substrate 110 are bonded and unified by depressing the chip 120 to the substrate 110. At this time, solder of the solder members 131 that is in the melted state expands transversally, as illustrated in FIG. 1B. Particularly, in an area close to the center of the device chip in which the distance between the insulative substrate 111 and the piezoelectric substrate 121 is small, solder of the solder members 131 in the melted state expands over the underlying film 125 greatly and may flow up to the vibration part 122 and/or the interconnection 123, as indicated by a circle depicted by a broken line. In this case, the defective solder member 131 may disturb the vibration of the vibration part 122. Further, there is a possibility that a short-circuit may be caused between electrode fingers of the IDT, between the solder members 131, between the solder members 132 and/or between the solder members 131 and 132. In a case where a large amount of solders for the solder members 131 and 132 is used, the solder members 131 and 132 in the melted state expand more greatly, and the above problem is more likely to occur.

The process of bonding with the solder members 131 and 132 may use flux. In the case where the distance between the chip support substrate 110 and the acoustic wave device chip 120 is small, scattered flux may adhere to the vibration part 122 or the interconnections 123. Adhesion of the scattered flux to the vibration part 122 or the interconnections 123 may cause a deterioration of the characteristics of the acoustic wave device chip 120. That is, an increased coplanarity of the upper surface of the insulative substrate 111 functioning as the chip support substrate 110 may degrade the reliability of the acoustic wave device.

Figure 2:
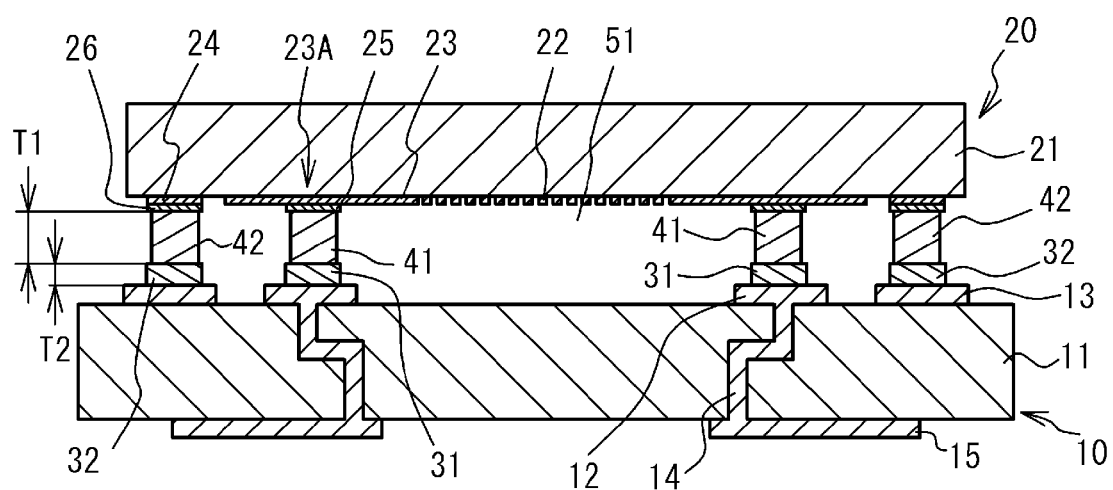
FIG. 2 is a cross-sectional view of an acoustic wave device in accordance with a first embodiment.

A first embodiment is now described with reference to FIGS. 2, 3A and 3B. FIG. 2 is a cross-sectional view taken along lines A-A illustrated in FIGS. 3A and 3B.

Referring to FIG. 2, an acoustic wave device 100 in accordance with a first embodiment has an insulative substrate 11 on which there are formed electrodes 12, a seal metal layer 13, via interconnections 14 and external connection terminals 15. The insulative substrate 11 is a chip support substrate 10. The insulative substrate 11 may be made of resin such as epoxy resin or an insulative substance such as ceramic. The insulative substrate 11 may be a single-layer substrate or a multi-layer substrate. The electrodes 12, the sealing metal layer 13, the via interconnections 14 and the external connection terminals 15 may be made of a metal, which is, for example, a sintered compact of tungsten paste. Further, the electrodes 12 and the seal metal layer 13 have a nickel layer and a gold layer formed on the nickel layer. The nickel layer is provided on the underlying film on the upper surface of the insulative substrate 11 on which an acoustic wave device chip 20 is mounted. The external connection terminals 15 are provided on the lower surface of the insulative substrate 11. The via interconnections 14 pass through the insulative substrate 11, and electrically interconnects the electrodes 12 and the external connection terminals 15. The seal metal layer 13 is formed into a loop shape so as to correspond to a seal metal layer 24 of the acoustic wave device chip 20.

The acoustic wave device chip 20 has a piezoelectric substrate 21 having a surface on which a vibration part 22, interconnections 23 and the seal metal layer 24 are provided. The piezoelectric substrate 21 is made of a piezoelectric substance such as $LiTaO_3$ or $LiNbO_3$. The vibration part 22 includes an IDT and reflectors, and excites an acoustic wave. In a case where the acoustic wave device chip 20 is a SAW device chip, the acoustic wave device chip 20 is flip-chip (face down) mounted on the upper surface of the insulative substrate 11, whereby the vibration part 22 faces the insulative substrate 11, and is exposed to a space 51. The distance between the vibration part 22 and the insulative substrate 11 is tens of μm, for example. Due to the presence of the space 51, the vibration of the vibration part 22 is not disturbed. In order to secure good vibration of the vibration part 22, the distance between the vibration part 22 and the insulative substrate 11 is not less than 1 μm.

The vibration part 22, the interconnections 23 and the seal metal layer 24 may be formed by an identical metal layer, which is, for example, an alloy of aluminum and copper and is 200 nm thick. The interconnections 23 extend from the vibration part 22 and include terminal portions 23A for making external connections. The seal metal layer 24 is formed into a loop shape on the mount surface of the piezoelectric substrate 21 on which the vibration part 22 is formed. The seal metal layer 24 extends along the peripheries of the mount surface of the piezoelectric substrate 21 so as to surround the vibration part 22 and the interconnections 23, and is spaced apart therefrom (electrically isolated therefrom). An underlying film 25 is provided on the surfaces of terminal portions 23A of the interconnections 23, and an underlying film 26 is provided on the surface of the seal metal layer 24. The underlying films 25 and 26 have a gold/titanium multilayer structure.

In the flip-chip bonding state, the underlying film 25 of the acoustic wave device chip 20 and the electrodes 12 of the chip support substrate 10 are connected together by post electrodes (second members) 41 disposed in contact with both the underlying film 25 and solder members (first member) 31 provided between the post electrodes 41 and the electrodes 12.

The underlying film 26 of the acoustic wave device chip 20 and the seal metal layer 13 of the chip support substrate 10 are connected together by a metal layer 42 disposed in contact with both the underlying film 26 and a solder member 32 provided between the metal layer 42 and the seal metal layer 13.

The seal metal layer 24 of the acoustic wave device chip 20 and the seal metal layer 13 of the chip support substrate 10 are mutually connected by the metal layer 42 and the solder member 32, whereby a seal ring (joining part) is formed to hermetically seal the vibration part 22 and the interconnections 23 of the acoustic wave device chip 20.

Figure 3A:
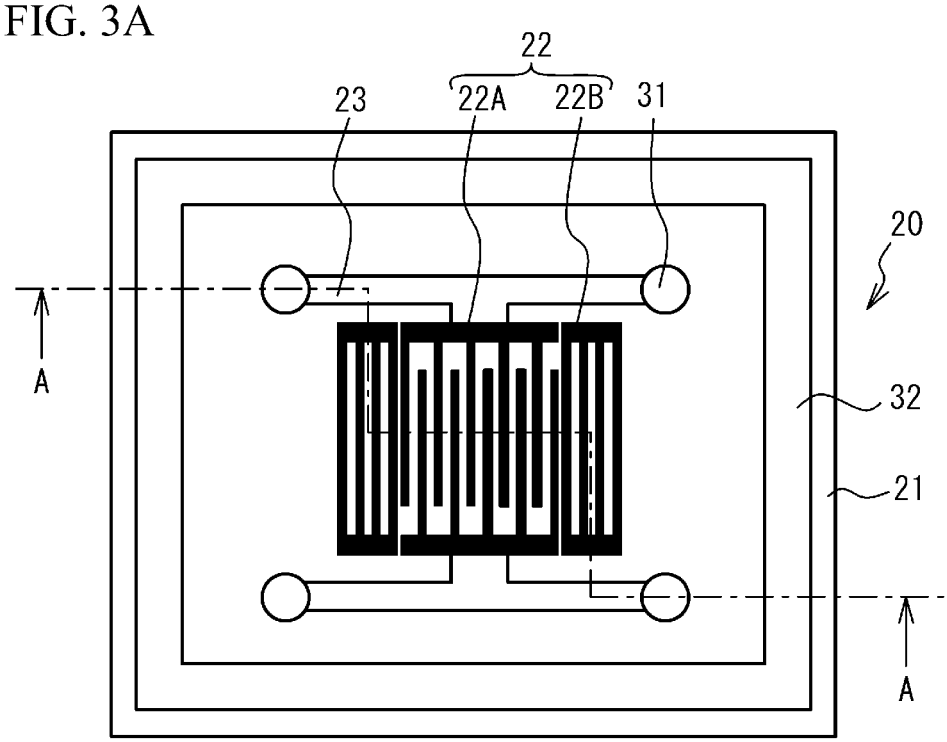
FIG. 3A is a plan view of an acoustic wave device chip of the acoustic wave device of the first embodiment.
Figure 3B:
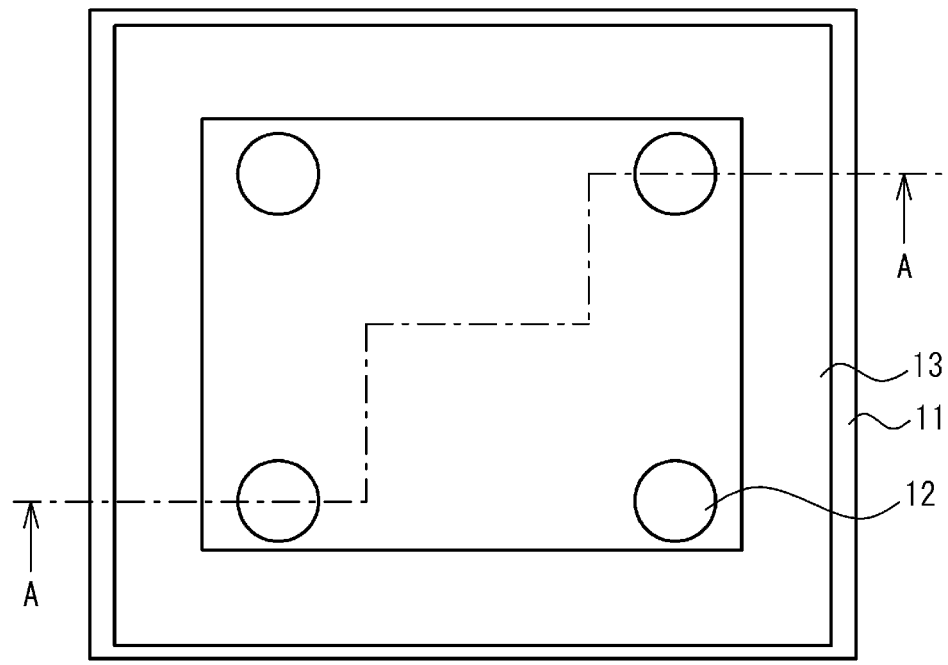
FIG. 3B is a plan view of an insulative substrate of the acoustic wave device of the first embodiment.

FIG. 3A illustrates an exemplary layout on the surface of the chip support substrate 10 used in the acoustic wave device 100, and FIG. 3B illustrates an exemplary layout on the surface of the acoustic wave device chip 20 used in the acoustic wave device 100. The surfaces illustrated in FIGS. 3A and 3B face each other.

Referring to FIG. 3A, the vibration part 22, the interconnections 23, the post electrodes 41 and the metal layer 42 are provided on the surface of the piezoelectric substrate 21 of the acoustic wave device chip 20, which surface faces the chip support substrate 10 (the post electrodes 41 and the metal layer 42 are not illustrated in FIG. 3A for the sake of simplicity). The solder members 31 are provided on the upper end surfaces of the post electrodes 41. The vibration part 22 includes an IDT 22A and reflectors 22B. The metal layer 42 has a predetermined thickness and is provided in the form of a loop or a ring along the peripheries of the surface of the piezoelectric substrate 21. The metal layer 42 is spaced apart from the vibration part 22, the interconnections and the post electrodes 41 and is electrically isolated therefrom. The metal layer 42 is provided so as to surround the vibration part 22, the interconnections 23 and the post electrodes 41. The solder member 32 is provided on the upper surface of the metal layer 42 that faces the chip support substrate 10.

As illustrated in FIG. 3B, the electrodes 12 and the seal metal layer 13 are provided on the surface of the chip support substrate 10 that faces the acoustic wave device chip 20. The electrodes 12 are provided in positions where the electrodes 12 face the post electrodes 41 of the acoustic wave device chip 20. The seal metal layer 13 is arranged in the form of a loop or a ring so as to correspond to the metal layer 42 of the acoustic wave device chip 20.

In the above structure, the vibration part 22 and the interconnections 23 may be made of an aluminum alloy and may be 200 nm thick, for example. The underlying films 25 and 26 are formed by stacking a gold layer having a thickness of 200 nm on a titanium layer having a thickness of 100 nm, for example. The post electrodes 41 and the metal layer 42 may be made of a substance having a melting point higher than that of solder used for the solder members 31 and 32 and may be made of copper, for example. The solder members 31 and 32 may be made of solder made of a metal such as an alloy of tin and silver, for example. The post electrodes 41 and the metal layer 42 may be 50 μm thick, for example.

A method for fabricating the acoustic wave device 100 in accordance with the first embodiment is now described with reference to FIGS. 4A through 6.

FIGS. 4A through 4C and FIGS. 5A and 5B illustrate a process for fabricating the acoustic wave device chip 20. These figures illustrate an exemplary arrangement in which two acoustic wave device chips are mounted on the piezoelectric substrate. First, an aluminum alloy layer 43 is formed on one of the two main surfaces of a piezoelectric substrate 21A having a large size by sputtering, for example. The aluminum alloy layer 43 is made of an aluminum alloy, which includes aluminum as the main component and copper added to aluminum. Next, the aluminum alloy layer 43 is selectively etched by dry etching, for example, whereby multiple acoustic wave device areas each including the vibration part 22 are formed. In this process, the interconnections 23 continuing to the vibration parts 22 are not formed (see FIG. 4A).

Then, a photoresist layer (not illustrated) is selectively formed on the aluminum alloy layer 43, and titanium and gold are stacked in this order by an evaporation method. Thereafter, the multilayer of gold and titanium are selectively removed by the lift-off method, and the underlying films 25 and 26 are formed (see FIG. 4B).

After that, a copper layer and a solder layer are stacked on the underlying films 25 and 26 in this order by electrolytic plating, for example. In this process, the aluminum alloy layer 43 functions as a power feed layer for electrolytic plating. Thereafter, the photoresist layer is removed. Then, the post electrodes 41 and the solder members 31 made of copper are formed on the underlying film 25, and the metal layer 42 and the solder member 32 made of copper are formed on the underlying film 26 (see FIG. 4C). The post electrodes 41 may have a diameter D1 of, for example, 50 μm.

The aluminum alloy layer 43 is subjected to a patterning process using wet etching so that the interconnections 23 continuing to the vibration parts 22 and the seal metal layer 24 are selectively formed (see FIG. 5A). Thus, the interconnections 23 and the seal metal layer 24 are separated from each other and are electrically isolated from each other. Then, a dicing process is applied to the piezoelectric substrate 21A, which is thus divided into individual acoustic wave device chips 20 (see FIG. 5B).

Figure 6:
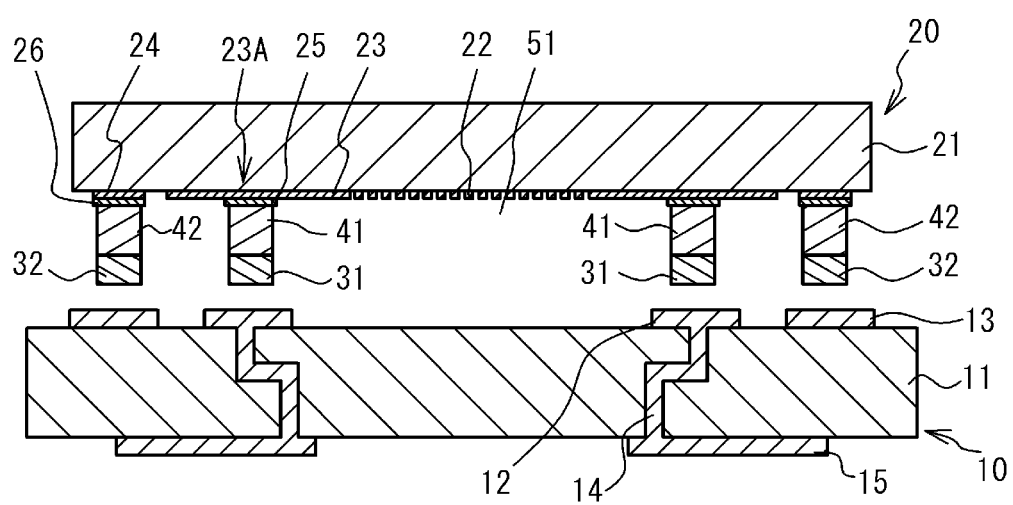
FIG. 6 is a cross-sectional view that illustrates the method for fabricating the acoustic wave device of the first embodiment and follows the step of FIG. 5B.

Referring to FIG. 6, the acoustic wave device chip 20 fabricated by the above process is flip-chip mounted on the insulative substrate 11. A solder reflow process for mounting is carried out so that the insulative substrate 11 and the acoustic wave device chip 20 are arranged in a low-oxygen-concentration atmosphere so as to face each other, and are heated and pressurized. The temperature used in the solder reflow process is selected so that solder is melted while the post electrodes 41 and the metal layer 42 are not melted. The solder reflow process melts the solder members 31 and 32, which respectively expand on the electrodes 12 and the seal meal layer 13 in a wet state. When the solder members 31 and 32 that have expanded in the wet state harden, the insulative substrate 11 and the acoustic wave device chip 20 are bonded and unified. The post electrodes 41 and the metal layer 42 are not melted and the thicknesses thereof are kept.

Figure 7:
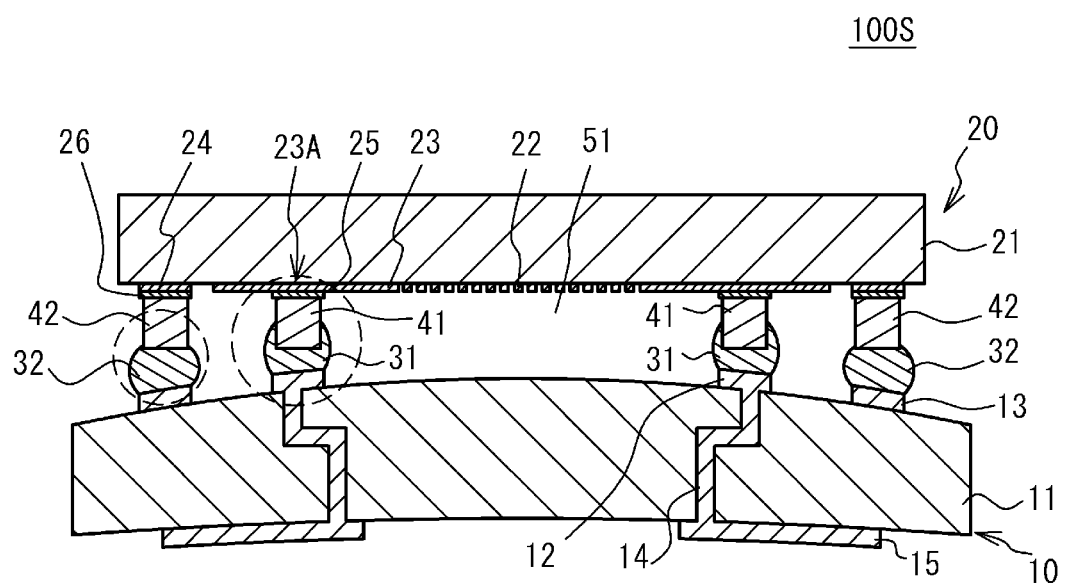
FIG. 7 is a cross-sectional view of the acoustic wave device.

A description is now given of a case where the insulative substrate 11 of the acoustic wave device 100 of the first embodiment is deformed or curved and the coplanarity deteriorates. FIG. 7 illustrates a state the acoustic wave device chip 20 that is mounted on the insulative substrate 11 having a deterioration of the coplanarity.

Referring to FIG. 7, an acoustic wave device 100S has the post electrodes 41 and the metal layer 42 that have a predetermined thickness. Therefore, even when the insulative substrate 11 is deformed in a convex way towards the acoustic wave device chip 20, the distance between the surface of the insulative substrate 11 and the surface of the acoustic wave device chip 20 is maintained sufficiently. Thus, the space 51 is secured. As indicated by circles depicted by broken lines in FIG. 7, since the post electrodes 41 have the predetermined thickness, the solder members 31 expand a longer distance on the outer surfaces of the post electrodes 41 in the wet state. Similarly, the metal layer 42 has the predetermined thickness, the solder member 32 expands a longer distance on the outer surfaces of the metal layer 42. It is thus possible to restrain the solder members 31 and 32 from flowing up to the interconnections 23 of the acoustic wave device chip 20 and to restrain the solder members 31 and 32 from flowing up to the vibration part 22 more reliably. In the case where the post electrodes 41 and the metal layer 42 are made of copper, SnAg-based solder has a low solder wettability, whereby expansion of solder in the wet state can be further suppressed.

According to the first embodiment, the electrodes 12 and the seal ring are provided with the solder members 31 and 32, and the post electrodes 41 and the metal layer 42, which are thicker than a variation of the coplanarity of the upper surface of the insulative substrate 11 (the above variation is an amount estimated after the fabrication process is completed). That is, the post electrodes 41 and the metal layer 42 have a thickness larger than the coplanarity of the upper surface of the insulative substrate 11. Therefore, even when the insulative substrate 11 is deformed, the space 51 is secured. Further, the solder members 31 expand to the post electrodes 41 in the wet state, and the solder member 32 expands to the metal layer 42 in the wet state. It is thus possible to restrain the solder members 31 and 32 from contacting the vibration part 22 and the interconnection 23 and to restrain the solder members 31 and 32 from contacting each other. Further, since the distance between the insulative substrate 11 and the acoustic wave device chip 20 is large, it is possible to restrain scattered flux used in the bonding process from adhering to the vibration part 22 and other portions. Thus, the vibration part 22 is capable of vibrating without any disturbance. It is therefore possible to suppress the deterioration of the characteristics of the acoustic wave device and the occurrence of short-circuit and to realize the more reliable acoustic wave device.

The solder members 31 are required to have an amount capable of absorbing variations in the distance between the electrodes 12 and the post electrodes 41 caused by the coplanarity. The solder member 32 is required to have an amount capable of absorbing variations in the distance between the seal metal layer 13 and the metal layer 42. Preferably, the post electrodes 41 and the metal layer 42 are thicker than the solder members 31 and 32. The thicknesses of the solder members 31 and 32 are those measured after the fabrication of the acoustic wave device 100 is completed (in other words, the solder reflow process is completed). The thickness of the solder members 31 is the thickness of the solder layer formed between the post electrodes 41 and the electrodes 12. The thickness of the solder member 31 is the thickness of the solder layer formed between the metal layer 42 and the seal metal layer 13. In the case where the post electrodes 41 and the metal layer 42 are comparatively thick, the range in which the solder members 31 and 32 expand in the wet state is more likely to stay on the post electrodes 41 and the metal layer 42, and it is more difficult for the solder members 31 and 32 to expand to the insulative substrate 11 and the piezoelectric substrate 21 in the wet state. It is thus possible to enhance the reliability of the acoustic wave device more effectively. Even if solder in the wet state expands to the piezoelectric substrate 21, there is no substantial problem as long as the solder does not reach the vibration part 22.

The electrodes 12 and the seal metal layer 13 have a higher solder wettability than the post electrodes 41 and the metal layer 42. The post electrodes 41 and the metal layer 42 have a higher solder wettability than the insulative substrate 11 and the piezoelectric substrate 21. Thus, the solder members 31 are likely to expand to the post electrodes 41 in the wet state, as compared with the insulative substrate 11 and the piezoelectric substrate 21. The solder member 32 is likely to expand to the metal layer 42, as compared with the insulative substrate 11 and the piezoelectric substrate 21. That is, the solder members 31 are likely to stay on the post electrodes 41, and the solder member 32 is likely to stay on the metal layer 42. It is therefore possible to restrain the solder members 31 and 32 from expanding to the insulative substrate 11 and the piezoelectric substrate 21 in the wet state. It is thus possible to effectively prevent a short-circuit from taking place and to effectively prevent the solder members 31 and 32 from contacting the vibration part 22 or the interconnections 23. It is further possible to prevent the solder members 31 from contacting each other and prevent the solder members 32 from contacting each other and to prevent the solder members 31 and 32 from contacting each other.

As has been described previously with reference to FIGS. 3A and 3B, the seal metal layer 24 is provided along the outer peripheries of the piezoelectric substrate 21 so as to surround the vibration part 22. This arrangement may cause large stress to be applied to the piezoelectric substrate 21 when the temperature rises in the solder reflow process, for example. According to the first embodiment, the metal layer 42 has a thickness larger than the thicknesses of the solder members 31 and 32, whereby stress applied to the piezoelectric substrate 21 is dispersed. Since the post electrodes 41 function as posts for supporting the piezoelectric substrate 21, stress applied to the piezoelectric substrate 21 is relaxed. Thus, it is possible to suppress a break of the piezoelectric substrate 21 and improve the reliability of the acoustic wave device more effectively. A dummy electrode for relaxing stress may be provided besides the post electrodes 41. In FIGS. 2 and 3A, the post electrodes 41 are provided inside the metal layer 42. Alternatively, the post electrodes 41 may be provided outside of the metal layer 42. It is also possible to provide, further out than the metal layer 42, a seal member made of resin such as polyimide or epoxy resin or a metal such as solder or nickel.

The insulative substrate 11 may be made of an insulator such as ceramic, resin or glass. Besides the insulative substrate 11, a semi-insulation substrate, a conductive substrate, a piezoelectric substrate, a printed-circuit board may be used. The semi-insulation substrate may be made of silicon, for example. The conductive substrate may be made of a metal such as nickel, 42 alloy, Kovar, or stainless. The piezoelectric substrate may be made of lithium tantalate or lithium niobate.

The vibration part 22 and the interconnections 23 may be made of a metal other than an aluminum-copper alloy such as a copper alloy, gold or titanium. The thicknesses of the vibration part 22 and the interconnections 23 may be 100~500 nm. The underlying films 25 and 26 may be made of a copper alloy, nickel, chromium, platinum besides the gold/titanium layer. The thicknesses of the underlying films 25 and 26 may be 50~1000 nm. The solder members 31 and 32 may be made of a metal other than tin-silver alloy such as tin, or a tin alloy including a metal other than silver. Thicknesses T2 of the solder members 31 and 32 may be 1~30 µm, and diameters D2 thereof may be 15~250 µm, for example. The post electrodes 41 and the metal layer 42 may be made of a metal other than copper such as gold, nickel, an gold-tin alloy or a copper-tin alloy, or may be a sintered compact of conductive paste including silver or copper. The thickness T1 of the post electrodes 41 may be 5~300 µm, and the diameter D1 thereof may be 10~200 µm, for example. The metal layer 42 may be replaced with resin and a metal film covering the outside of the resin. The metal film may be made of gold, copper or nickel, for example. Irrespective of the materials used, the post electrodes 41 and the metal layer 42 have a melting point higher than the solder members 31 and 32.

As described above, the post electrodes 41 and the metal layer 42 may be made of different materials. However, the separate processes are required to realize the above. In contrast, the use of the identical material for the post electrodes 41 and the metal layer 42 makes it possible to use the same process. In this regard, it is preferable to use the identical material for the post electrodes 41 and the metal layer 42. Since the solder member 32 and the metal layer 42 are electrically conductive, the metal layer 42 functions as a shield that protects the acoustic wave device chip 20 from noise. In this case, when the metal layer 42 is grounded, the shield effect is enhanced. Therefore, it is preferable to connect the metal layer 42 to a ground electrode (not illustrated) on the acoustic wave device chip 20 or the insulative substrate 11. The metal layer 42 completely surrounds the vibration part 22 or partly surrounds the vibration part 22 so that a part of the metal layer 42 is exposed. Of course, the complete surrounding realizes better shielding.

A first variation of the first embodiment is described. FIGS. 8A through 8C are cross-sectional views that illustrate a method for fabricating an acoustic wave device in accordance with a variation of the first embodiment. The steps illustrated in FIGS. 4A through 5B are common to the variation of the first embodiment.

Referring to FIG. 8A, multiple acoustic wave device chips 20 are flip-chip mounted on a substrate 11A. Referring to FIG. 8B, a seed metal (not illustrated) is formed by sputtering and a metal coat layer 61 made of a metal such as nickel is formed by electrolytic plating. After that, as illustrated in FIG. 8C, the substrate 11A is divided into multiple acoustic wave devices 100A by dicing. The acoustic wave devices 100A thus obtained are those in accordance with the variation of the first embodiment.

According to the variation of the first embodiment, deterioration of the characteristics of the acoustic wave devices and the occurrence of a short circuit are suppressed, and the acoustic wave devices 100A are more reliable. The metal coat layer 61 made of nickel or the like covers the entire chip, and the hermetic seal is thus strengthened. The first embodiment may employ the metal coat layer 61. The metal coat layer 61 may be replaced by a resin coat layer, which is formed by applying resin such as epoxy resin to the chip. The resin coat layer also strengthens the hermetical seal. As illustrated in FIG. 8A, resin for seal such as epoxy resin may be applied to all the multiple acoustic wave device chips 20 mounted on the substrate 11A at once by a transfer mold method for a compression molding method. Then, the seal resin and the substrate 11A are subjected to the dicing process together, whereby the multiple acoustic wave devices are produced.

Second Embodiment

Figure 9:
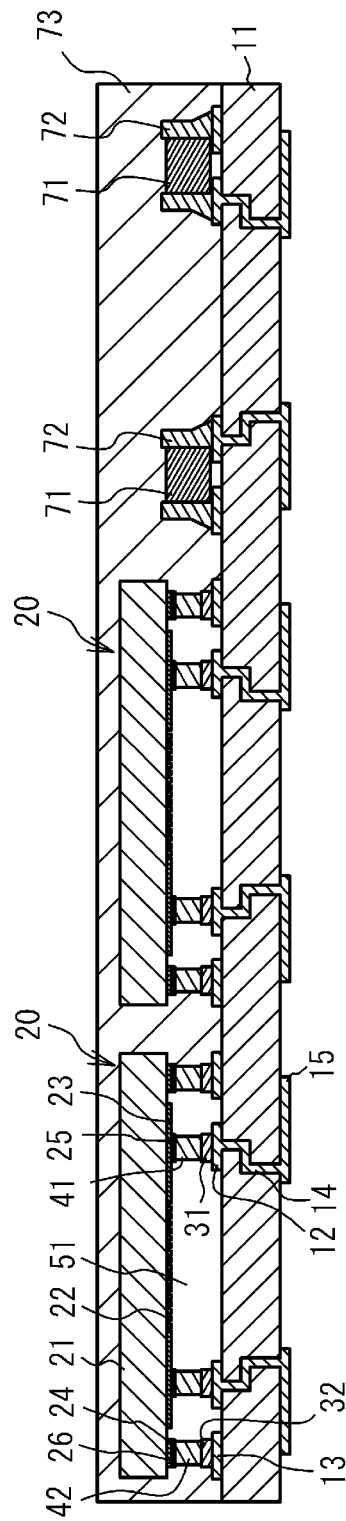
FIG. 9 is a cross-sectional view of a module in accordance with a second embodiment.

A second embodiment is an exemplary module using at least one acoustic wave device chip 20 of the first embodiment. FIG. 9 is a cross-sectional view of a module in accordance with the second embodiment, in which those parts that are the same as those illustrated in FIG. 2 are given the same reference numerals and a description thereof is omitted here.

Referring to FIG. 9, a module 200 of the second embodiment is configured to have two acoustic wave device chips 20 and two chip components 71 mounted on the insulative substrate 11. The chip components 71 are mounted on the insulative substrate 11 by solder members 72. The chip components 71 may be an inductor, a capacitor, an integrated circuit chip or the like. The acoustic wave device chips 20 and the chip components 71 are coated with a seal resin layer 73 made of epoxy resin, for example, and are hermetically sealed therewith.

The module 200 may have one acoustic wave device chip 20 and one chip component 71. The module 200 may have three or more acoustic wave device chips 20 and three or more chip components 71. In a case where the module 200 has multiple acoustic wave device chips 20 or multiple chip components 71, the insulative substrate 11 has an increased area and the interconnection pattern formed on the insulative substrate 11 may be complicated. In such a case, the coplanarity on the upper surface of the insulative substrate 11 may deteriorate. However, the above-mentioned electrode structure of the acoustic wave device chip 20 suppresses deterioration of the characteristic of the acoustic wave device chip 20 and improves the reliability of the module.

The solder members 31, 32 and 72 may be formed by solder paste. Therefore, a simple process may be used to fabricate the module 200.

The acoustic wave device chip 20 is not limited to the SAW device chip but may be a boundary acoustic wave device chip, an FBAR and so on. When the FBAR is used, the piezoelectric substrate 21 is replaced with another substrate made of silicon, for example. In the FBAR, the vibration part 22 includes a piezoelectric thin-film, and upper and lower electrodes respectively provided to opposite surfaces of the piezoelectric thin-film.

The present invention is not limited to the specifically described embodiments, but other embodiments and variations may be made without departing from the scope of the claimed invention.

What is claimed is:

1. An acoustic wave device comprising:
   a substrate;
   an acoustic wave device chip that has a vibration part exciting an acoustic wave and is mounted on a surface of the substrate so that the vibration part is exposed to a space formed between the substrate and the acoustic wave device chip; and
   a joining part that is provided so as to surround the vibration part and joins the substrate and the acoustic wave device chip together,
   the joining part including a first member made of solder, and a second member that is stacked on the first member and is made of a substance having a melting point higher than the solder, the second member having a thickness larger than a coplanarity of the surface of the substrate.

2. The acoustic wave device according to claim 1, wherein the thickness of the second member is larger than that of the first member.

3. The acoustic wave device according to claim 1, further comprising a metal layer provided on the surface of the substrate, wherein:
   the second member is closer to the acoustic wave device chip than the first member;
   the first member contacts the metal layer;
   the metal layer has a solder wettability higher than the substance of the second member; and
   the substance of the second member has a solder wettability higher than the substrate.

4. The acoustic wave device according to claim 1, wherein the joining part completely surrounds the vibration part.

5. The acoustic wave device according to claim 1, further comprising an electrode that electrically connects the substrate and the acoustic wave device chip together, and includes solder that is the same as the solder of the first member and a substance that is the same as the substance of the second member.

* * * * *